US008048588B2

(12) United States Patent
Tan et al.

(10) Patent No.: US 8,048,588 B2
(45) Date of Patent: Nov. 1, 2011

(54) METHOD AND APPARATUS FOR REMOVING RADIATION SIDE LOBES

(75) Inventors: Sia Kim Tan, Singapore (SG); Soon Yoeng Tan, Singapore (SG); Qunying Lin, Singapore (SG); Huey Ming Chong, Singapore (SG); Liang-Choo Hsia, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 2048 days.

(21) Appl. No.: 10/970,077

(22) Filed: Oct. 20, 2004

(65) Prior Publication Data

US 2006/0083994 A1    Apr. 20, 2006

(51) Int. Cl.
    *G03F 1/00*    (2006.01)
    *G03C 5/00*    (2006.01)
    *G06F 17/50*    (2006.01)

(52) U.S. Cl. .................. 430/5; 430/30; 716/53

(58) Field of Classification Search ... 430/5; 716/19–21
See application file for complete search history.

(56) References Cited

U.S. PATENT DOCUMENTS

| | | | | |
|---|---|---|---|---|
| 5,914,204 A * | 6/1999 | Lee | | 430/5 |
| 6,214,497 B1 * | 4/2001 | Stanton | | 430/5 |
| 6,335,130 B1 * | 1/2002 | Chen et al. | | 430/5 |
| 6,670,080 B2 | 12/2003 | Sugita et al. | | |
| 7,056,645 B2 * | 6/2006 | Sivakumar et al. | | 430/311 |
| 7,354,682 B1 * | 4/2008 | Capodieci | | 430/5 |
| 2004/0101764 A1 * | 5/2004 | Nyhus et al. | | 430/5 |

OTHER PUBLICATIONS

"Dark-field high-transmission chromeless lithography", George E. Bailey, Neal P. Callan, Kunal N. Taravade, John V. Jensen, Benjamin G. Eynon, Patrick M. Martin, Henry H. Kamberian, Darren Taylor, and Rick S. Farnbach, Proc. SPIE 5040, 203 (2003).*

* cited by examiner

*Primary Examiner* — Mark F Huff
*Assistant Examiner* — Jonathan Jelsma
(74) *Attorney, Agent, or Firm* — Mikio Ishimaru

(57) ABSTRACT

A method and structure for removing side lobes is provided by positioning first and second radiation transparent regions of respective first and second phases at a first plane with the first and second phases being substantially out of phase. Further, positioning the first and the second region to cause radiation at a second plane to be neutralized in a first region, not to be neutralized in a second region, and to have a side lobe in a third region. Further, positioning a non-transparent region at the first plane to assure radiation at the second plane to be neutralized in the first region and positioning a third radiation transparent region of the first or second phase at the first plane to neutralize the side lobes in the third region at the second plane.

20 Claims, 9 Drawing Sheets

METHOD AND APPARATUS FOR REMOVING RADIATION SIDE LOBES

TECHNICAL FIELD

The present invention relates generally to photolithography and more particularly to patterning different types of photolithography features.

BACKGROUND ART

Integrated circuits are now used in almost every type of electronic product ranging from toys to massive computers. These integrated circuits are all generally made by a photolithographic process, which involves manufacturing a template containing patterns of the electrical circuit as transparent and opaque areas. The patterned template is referred to as a "reticle" or "mask".

A radiation source, such as a light, is used to copy or "pattern" multiple images of the mask onto a photosensitive material, such as a photoresist, on the surface of a silicon wafer. Once features are patterned on the photoresist, further processing is performed to form various structures on the silicon wafer. The completed wafer is then cut (or "diced") to form the individual integrated circuits.

Engineers typically use computer aided design ("CAD") to create a schematic design of the mask. One technique, Levenson Phase-Shifting, also known as Alternating Aperture Phase-Shifting, is used to create small features on integrated circuits. Such small features are generated by a pair of areas in the mask called shifters separated by an opaque region.

The opaque region, typically made of chrome, does not allow radiation such as light to pass through. However, the shifters allow light to pass through and change the phase of the light. Two shifters can be used to shine light on the same region of a photoresist. When the light passing through one of the shifters is out of phase with the light passing through the other shifter, a feature is created on the photoresist that is narrower than the opaque region separating the shifters. By reducing the size of the opaque region, and thus the distance between the two shifters, very small features can be created on the photoresist. The width of the feature can be considerably less than could be produced by the same optical system without phase shifting.

When light from one shifter is 180° out of phase and overlaps with the light from the other shifter, destructive interference occurs and the light from the two shifters cancels. Controlling the phase of the light passing through the mask can be extended to the point where all of the opaque regions are created by destructive interference as opposed to blocking the light with chrome. A chromeless phase-shifting mask transmits 100% of the light and is used in a technique called phase edge chromeless off axis lithography ("PCO"), also known as chromeless phase lithography ("CPL").

However, the use of CPL can cause artifacts to appear. Artifacts are unwanted features in the photoresist created by areas of secondary light intensity. One type of artifact is a side lobe. Side lobes typically appear as small halos in the photoresist.

One technique used to prevent side lobes is the use of a chrome patch. When properly placed on the mask, chrome patches block light of secondary intensity and prevent side lobes from forming in the photoresist.

Unfortunately, shifters can limit the placement and dimensions of chrome patches. Furthermore, as photolithographic technology continues to advance and mask designs continue to shrink, the risks of chrome lifting increase. Chrome lifting is the loss of the chrome patch, or portions of the patch, during processes such as mask cleaning.

What is needed, therefore, are improved methods and configurations for preventing side lobes from forming while decreasing the risk of chrome lifting.

Solutions to these problems have been long sought but prior developments have not taught or suggested any solutions and, thus, solutions to these problems have long eluded those skilled in the art.

DISCLOSURE OF THE INVENTION

The present invention provides a method and structure for removing side lobes by positioning first and second radiation transparent regions of respective first and second phases at a first plane with the second and second phases being substantially out of phase. Further, positioning the first and the second region to cause radiation at a second plane to be neutralized in a first region, not to be neutralized in a second region, and to have a side lobe in a third region. Further, positioning a non-transparent region at the first plane to assure radiation at the second plane to be neutralized in the first region and positioning a third radiation transparent region of the first or second phase at the first plane to neutralize the side lobes in the third region at the second plane.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings are semi-diagrammatic and not to scale and, particularly, some of the dimensions are for the clarity of presentation and are shown exaggerated in the FIGs.

The term "horizontal" as used herein is defined as a plane parallel to the conventional plane or surface of the semiconductor wafer or die, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The present system is described with respect to wavelengths in the ultra-violet range. However, it will be readily understood that the invention is applicable to any wavelength of radiation, and the modifications for other wavelengths will be obvious to those of ordinary skill in the art based on the description of the present invention provided herein.

Figure 1:
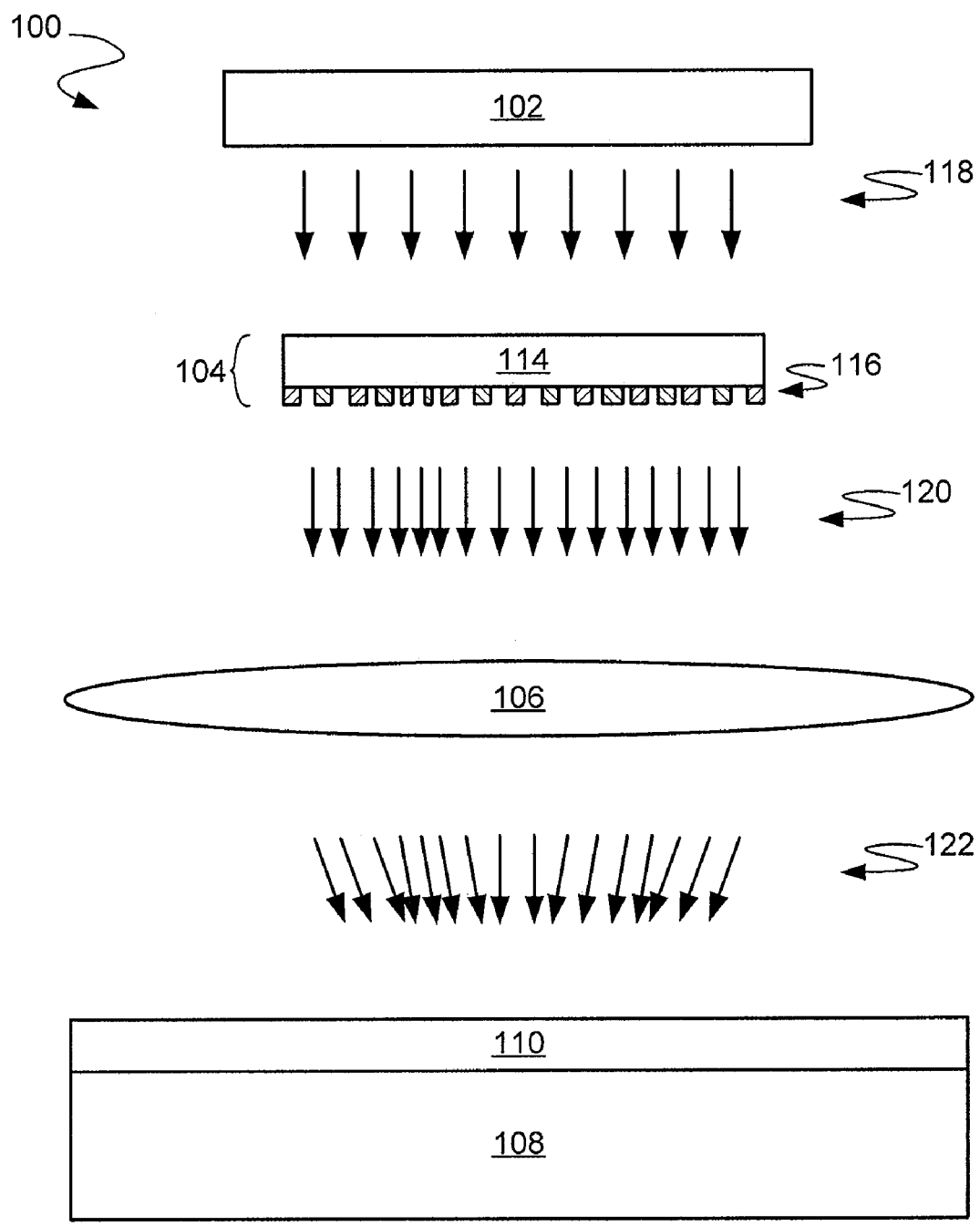
FIG. 1 (PRIOR ART) is a simplified schematic of a photolithographic system.

Referring now to FIG. 1 (PRIOR ART), therein is shown a simplified schematic of a photolithographic system 100. In the photolithographic system 100, radiation is directed from a radiation source 102 through a photomask 104 and a lens 106 onto a semiconductor wafer 108, on which will be formed a plurality of integrated circuits when completed. A photoresist layer 110 has been deposited on the semiconductor wafer 108.

The photomask 104 includes a light-transparent substrate 114, of a material such as fused silica or quartz, with a patterned mask coating 116.

The radiation source 102 can be a light that produces light 118 of a single wavelength, which the photomask 104 selectively allows through as patterned light 120 to be focused by the lens 106. Focused patterned light 122 reproduces the mask pattern of the patterned mask coating 116 on selected areas of the photoresist layer 110.

After exposure, the patterned photoresist layer 110 is used as a mask in a photolithographic process to form features or to implant regions on the semiconductor wafer 108 or on various layers of material previously deposited or grown on the semiconductor wafer 108. The goal in the photolithographic field is to keep reducing the size of such features and implant regions.

Unfortunately, in photolithographic systems, even a geometrically perfect lens cannot separate two points below a minimum distance. When the two points are less than this minimum distance from each other, they cannot be separated or "resolved". This is due to diffraction and interference effects. Diffraction effects, which are due to the wave nature of the light 118, cause peaks and valleys to occur in the intensity of the light 118 passing through an opening, such as an opening in the patterned mask coating 116, and falling on the photoresist layer 110 on the semiconductor wafer 108. Interference effects occur with side-by-side openings, where the peaks and valleys of the light waves can interfere so as to cancel each other out, or can reinforce and amplify each other, depending on the locations of the openings.

Depending upon how close two points are, the diffraction effect spreads the light from these two points across the imaging lens. If the two points are sufficiently close, the light will be diffracted out of the path of the lens. In this case, the points will be too close to each other and they will be under the limit of resolution of the system. The resolution of a non-perfect lens depends upon the wavelength of the light source and the numerical aperture ("NA") of the lens. Two images are considered as being resolvable when the intensity between them drops to 80 percent of the image intensity. Thus, two images are considered resolvable when the following equation is fulfilled:

$$2D = 0.6 \lambda / NA$$

where:
  $2D$ is the separation of the two images;
  $\lambda$ is the wavelength of the illumination source 102; and
  $NA$ is the numerical aperture of the lens 106.

In an effort to overcome diffraction and interference problems, various phase shifting systems have been developed.

Figure 2:
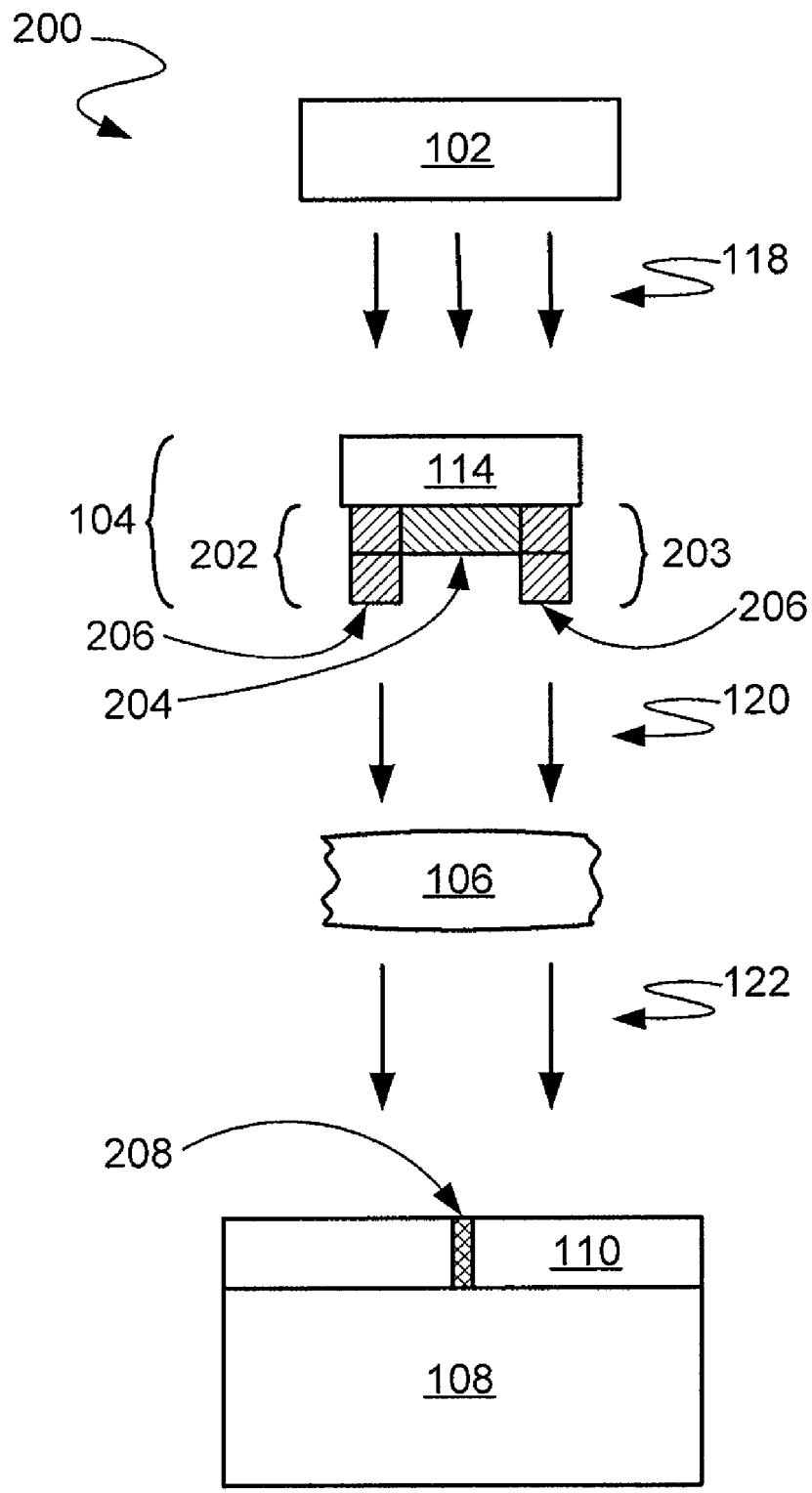
FIG. 2 (PRIOR ART) is a simplified schematic of a phase shifting system utilizing chromeless phase lithography.

Referring now to FIG. 2 (PRIOR ART), therein is shown a simplified schematic of a phase shifting system 200 utilizing chromeless phase lithography ("CPL"). The center portion of the lens 106 is pictured where the angle of the focused light 122 is least affected. As in the photolithographic system 100 (FIG. 1), light 118 of a single wavelength is directed from the illumination source 102 through the photomask 104 and the lens 106 onto the photoresist layer 110 on the semiconductor wafer 108.

The phase shifting system 200 has three adjacent shifters 202, 203, and 204 located at a first plane, such as the light-transparent substrate 114. The light 118 passes through the shifters 202, 203, and 204, which are transparent to light.

Since phase shifting of light occurs as a function of the thickness of the shifter material, an extra layer of shifter material 206 is added to shifters 202 and 203 to cause additional phase shifting. This extra layer of transparent material 206, such as silicon or quartz, produces a phase shift of 180° relative to the shifter 204. This corresponds to an optical path length difference of $\lambda/2$. Thus, the shifters 202 and 203 are substantially out of phase by 180 degrees, or $\pi$ radians, with the other shifter 204.

Since phases of light which are substantially out of phase destructively interfere and therefore cancel where they overlap, the shifters 202, 203, and 204 cause destructive interference in the patterned light 120 in a second plane, such as the photoresist layer 110. Thus, the shifters 202, 203, and 204 create a photoresist feature 208 in the photoresist layer 110 that is below or smaller than the inherent resolution limit of the lens 106 itself.

The phase shifting system 200 thus allows features such as the photoresist feature 208 to be much smaller than a system not using phase shifting. Unfortunately, however, phase shifting artifacts can occur.

Figure 3:
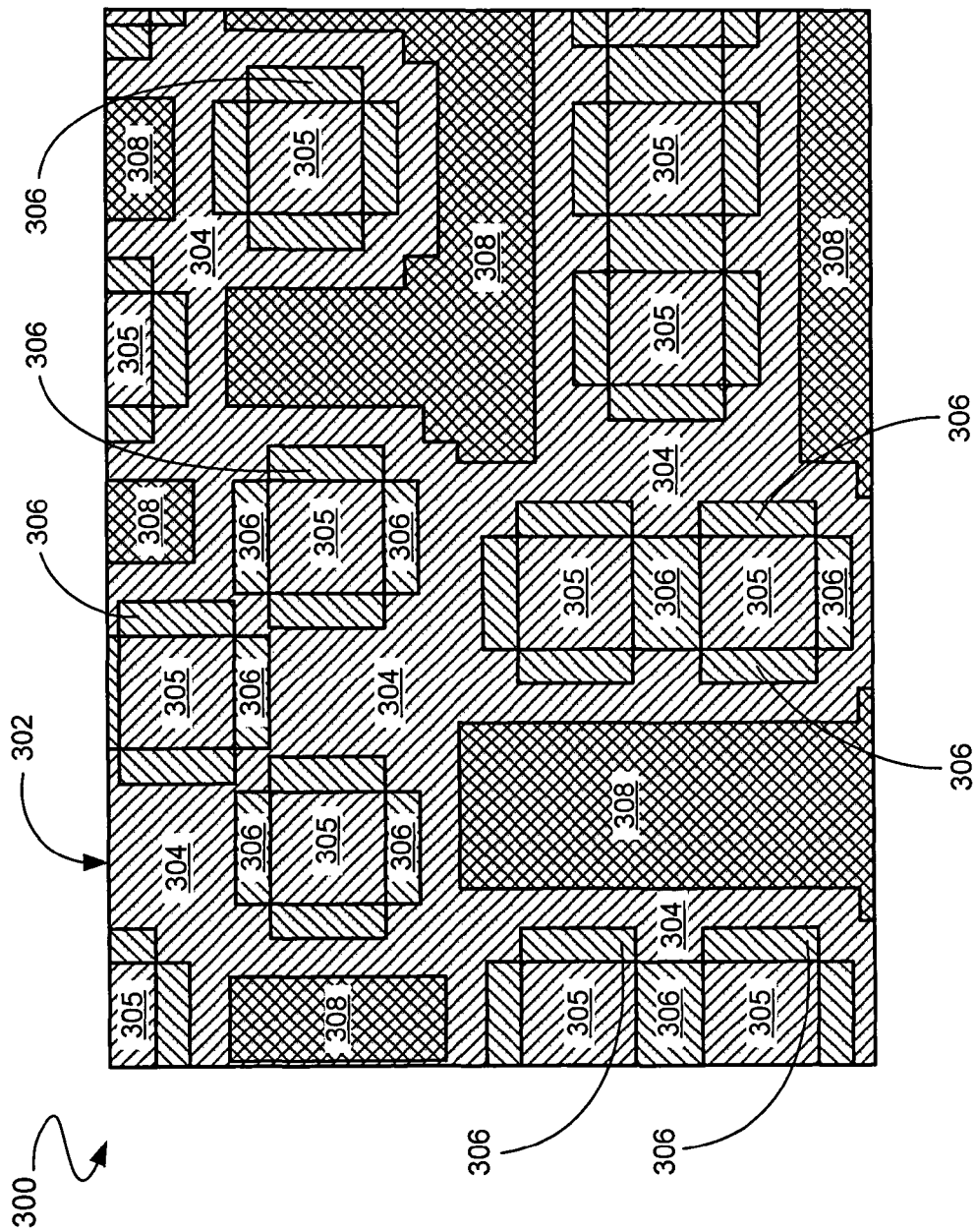
FIG. 3 is an illustration of a photomask design.

Referring now to FIG. 3, therein is shown an illustration of a photomask design 300 for forming contact holes. A photomask 302 has 0° phase regions 304 and 0° contact hole phase regions 305, which cause little or no phase shift of light passing through the regions, and orthogonally shaped 180° phase regions 306, which cause about a 180° phase shift of light passing through the regions. The orthogonally shaped 180° phase regions 306 form a square around design regions, such as the 0° contact hole phase regions 305. In addition, chrome patches 308 have been deposited on the photomask 302. The chrome patches 308 are non-transparent to the light 118 (FIG. 2). Thus, the light 118 (FIG. 2) will not pass through the chrome patches 308.

The structures of the present invention may be on, in, or under the photomask 302 but are considered to be all positioned at the photomask 302 to be effective in substantially the same plane.

In order for destructive interference to properly occur outside the 0° contact hole phase regions 305, the chrome patches 308 are no closer to the 0° contact hole phase regions 305 than a distance equal to the width of the orthogonally shaped 180° phase regions 306. Thus prepared, the photomask 302 is ready for patterning onto a focal plane such as a photoresist (not shown).

Figure 4:
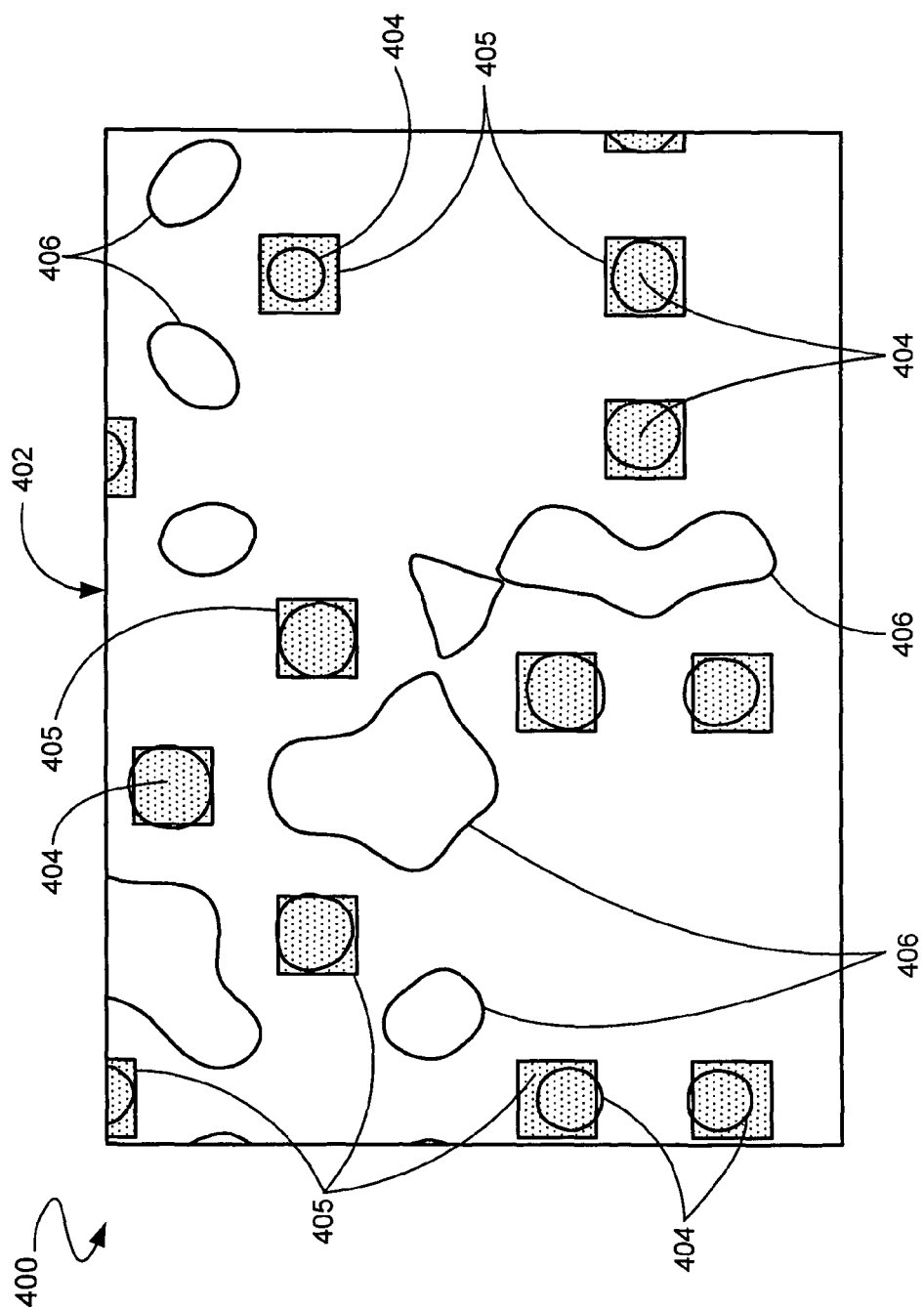
FIG. 4 is an illustration of a patterned photoresist resulting from the photomask illustrated in FIG. 3.

Referring now to FIG. 4, therein is shown an illustration of a patterned photoresist 400. A photoresist 402 has been patterned from the photomask 302 (of FIG. 3). Contact hole features 404 have been formed as desired in the photoresist 402 in contact hole target regions depicted by target squares 405. However, side lobes 406 have also formed in the photoresist 402.

The side lobes 406 are artifacts created during photolithography. Artifacts are unwanted features created in the photoresist 402 by areas of secondary light intensity. By strategically placing the chrome patches 308 (FIG. 3) to selectively prevent the transmission of light 118 (FIG. 2) through certain mask areas, the formation of such artifacts can be prevented. Unfortunately, the critical distance for destructive interference to occur limits the placement and dimensions of the chrome patches 308. Practical considerations such as chrome patch lifting also impose limitations on the use of chrome patches to control side lobe formation.

Figure 5:
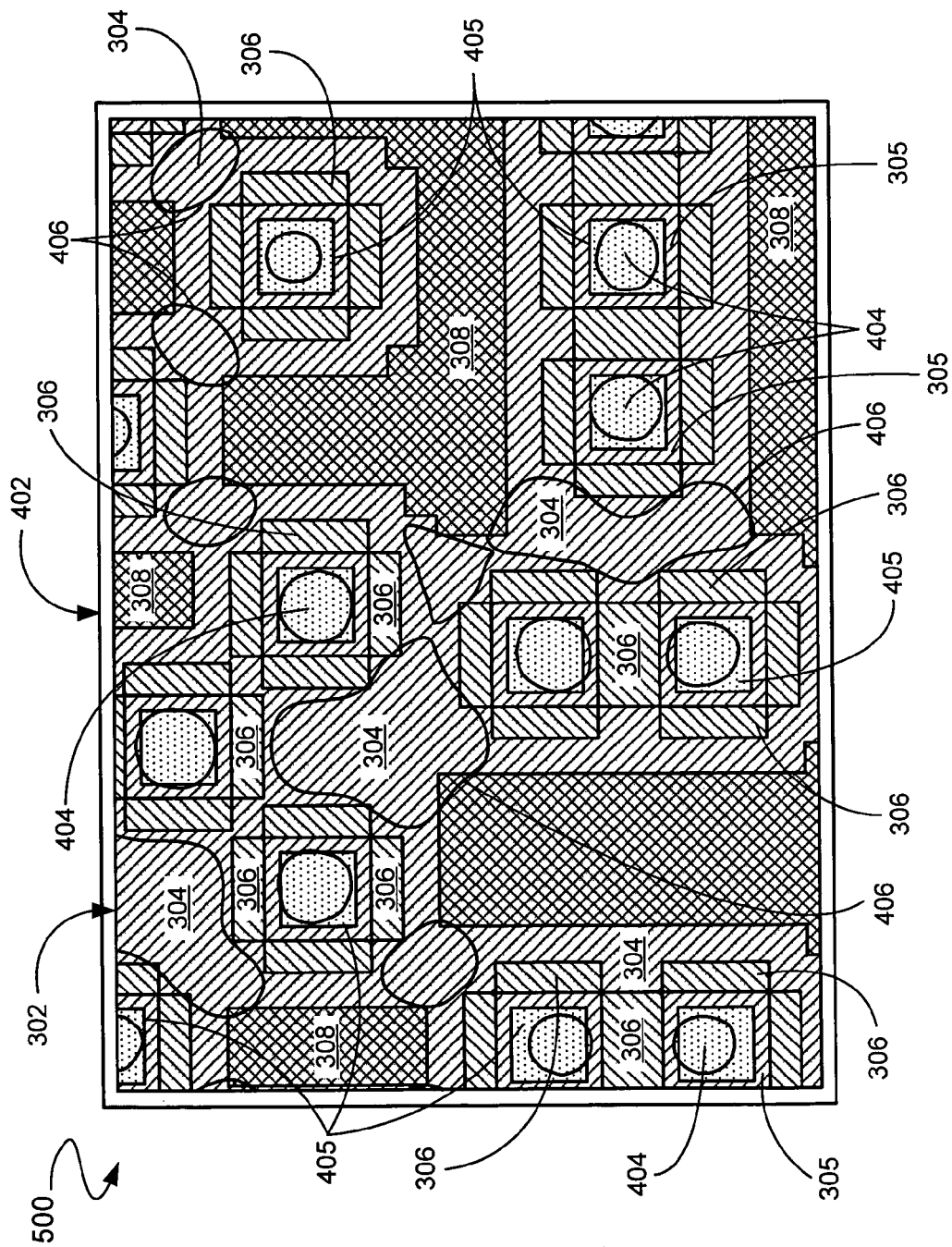
FIG. 5 is a depiction of the photomask design of FIG. 3 superimposed over the patterned photoresist depicted in FIG. 4.

Referring now to FIG. 5, therein is shown a depiction 500 of the photomask design 300 (FIG. 3) superimposed over the patterned photoresist 400 (FIG. 4). The photomask 302 is shown with the 0° phase regions 304, the 0° contact hole phase regions 305, and the orthogonally shaped 180° phase regions 306. The chrome patches 308 are also shown. In addition, the photoresist 402 is shown with the contact hole features 404, the target squares 405, and the side lobes 406.

The chrome patches 308 prevented the formation of side lobes in larger regions. However, in smaller regions, where the chrome patches 308 could not effectively be used, the side lobes 406 have formed.

Figure 6:
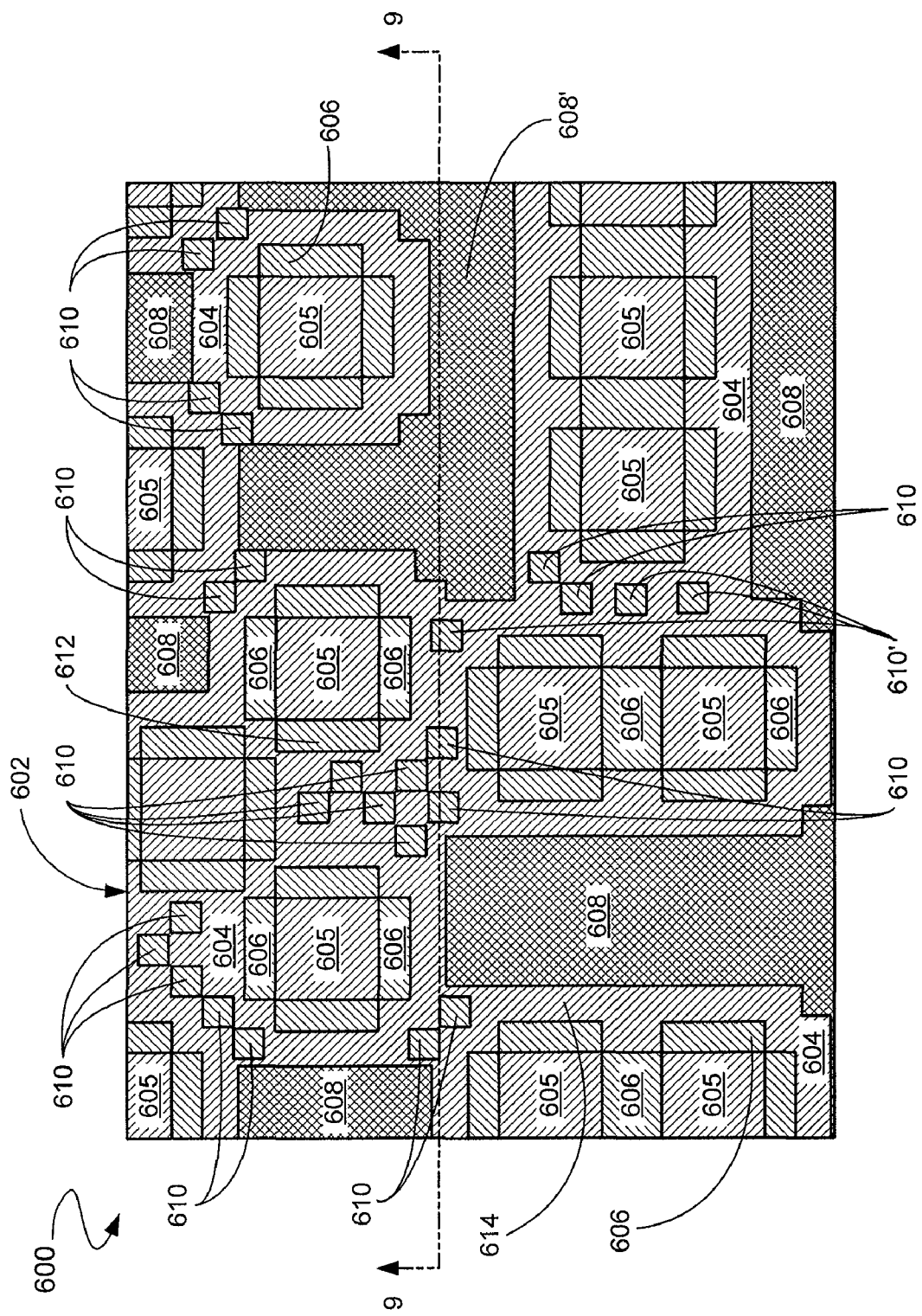
FIG. 6 is an illustration of a side lobe reducing photomask design in accordance with an embodiment of the present invention.

Referring now to FIG. 6, therein is shown an illustration of a side lobe reducing photomask design 600 in accordance with an embodiment of the present invention. A photomask 602 has orthogonally shaped 0° phase regions 604, orthogonally shaped 0° contact hole phase regions 605, and orthogonally shaped 180° phase regions 606 and 612. Furthermore, chrome patches 608 and 608', which prevent the passage of light therethrough, have been deposited on the photomask 602. In order for destructive interference to properly occur, the chrome patches 608 and 608' are no closer to the orthogonally shaped 0° contact hole phase regions 605 than a distance equal to the width of the orthogonally shaped 180° phase regions 606 and 612. The orthogonally shaped 180° phase regions 606 form a square around the orthogonally shaped 0° contact hole phase regions 605.

It has been discovered that positioning a region of mixed phases at the photomask design 600 can neutralize the side lobes in the photoresist in regions where non-transparent chrome will not perform the function or where the chrome layer will be too small and will be subject to lift-off. Thus, the region will be smaller than the non-transparent regions and fit into spaces too small for the non-transparent regions.

For example, the addition of 180° phase subregions 610, shaped in one embodiment as squares and placed in an alternating checkerboard pattern, prevents the formation of the side lobes 406 (FIG. 4) in those regions. In another example, in regions too small for the alternating checkerboard pattern but wide enough for single subregions, the addition of single, square 180° phase subregions 610' prevents the formation of the side lobes 406 (FIG. 4). This discovery is particularly valuable in spaces that are too small for chrome patches to prevent formation of the side lobes 406. Thus, for destructive interference to occur and the side lobes 406 (FIG. 4) to be eliminated, the 180° phase subregions 610 are placed, for example, in regions where spacing is greater than two times the width of a corresponding phase region, for example the orthogonally shaped 180° phase region 612. The 180° phase subregions 610 are not utilized in narrower regions, such as region 614. Thus prepared, the photomask 602 is ready for patterning onto a photoresist (not shown).

Where the sizes of the various regions are established generally by their lengths and widths, the subregions will be smaller than the lengths of the regions but about the same widths as the regions. The subregions supplement the non-transparent regions so will generally fill spaces where there are problems with those regions. It has been discovered that the subregions work well where the space is larger than two times the width and less than four times the width of an adjacent region.

Figure 7:
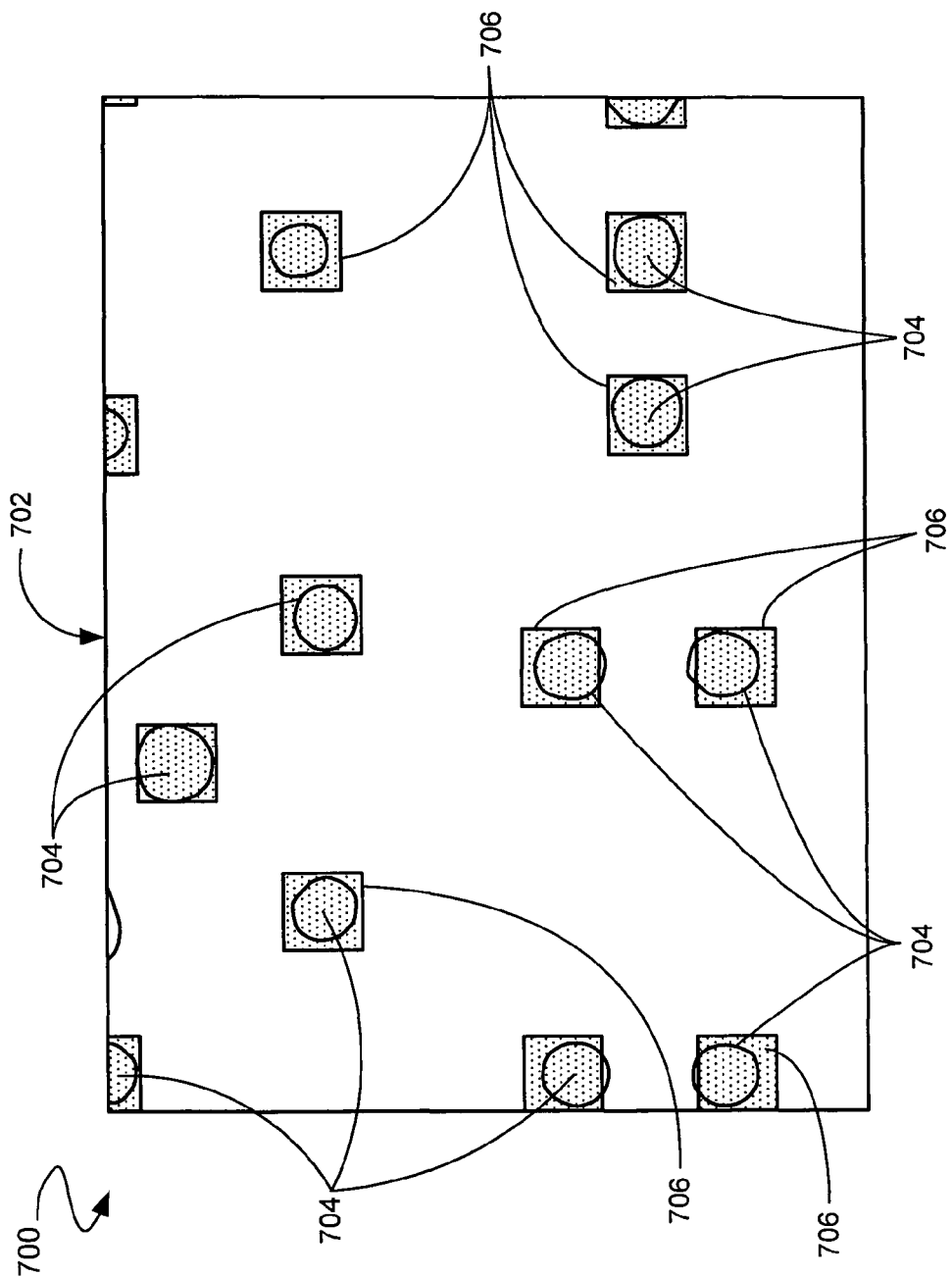
FIG. 7 is an illustration of a reduced side lobe patterned photoresist resulting from the photomask illustrated in FIG. 6.

Referring now to FIG. 7, therein is shown an illustration of a reduced side lobe patterned photoresist 700. A photoresist 702 has been patterned from the photomask 602 (FIG. 6). Contact hole features 704 have been formed as desired in the photoresist 702 in contact hole target squares 706 as desired. Formation of the side lobes 406 (FIG. 4) has been suppressed.

Figure 8:
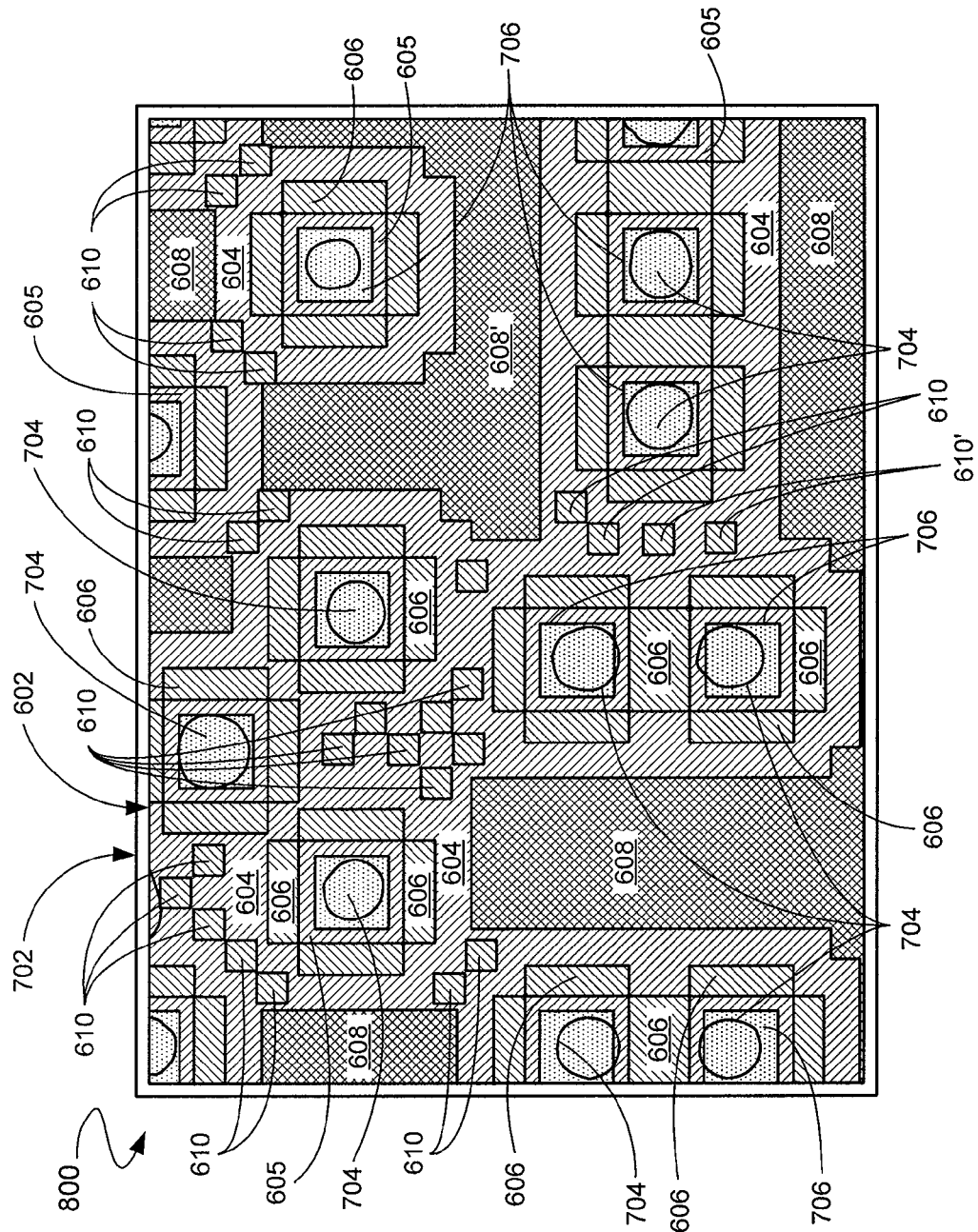
FIG. 8 is a depiction of the side lobe reducing photomask design of FIG. 6 superimposed over the reduced side lobe patterned photoresist depicted in FIG. 7.

Referring now to FIG. 8, therein is shown a depiction 800 of the side lobe reducing photomask design 600 (FIG. 6) superimposed over the reduced side lobe patterned photoresist 700 (FIG. 7). The photomask 602 is shown with the orthogonally shaped 0° phase regions 604, the orthogonally shaped 0° contact hole phase regions 605, the 180° phase subregions 610, and the orthogonally shaped 180° phase regions 606. The chrome patches 608 and 608' are also shown. In addition, the photoresist 702 is shown with the contact hole features 704 and the target squares 706.

The chrome patches 608 and 608' have prevented formation of the side lobes 406 (FIG. 4) in larger regions. In smaller regions, where the chrome patches 608 and 608' could not be used, the square 180° phase subregions 610, placed in a checkerboard pattern, prevented the formation of the side lobes 406 (FIG. 4). The combination of the chrome patches 608 and 608' and the 180° phase subregions 610 substantially limits the formation of the side lobes 406 (FIG. 4). This can be accomplished for isolated contact holes, semi-dense contact holes, dense array contact holes, and randomly distributed contact hole configurations.

Figure 9:
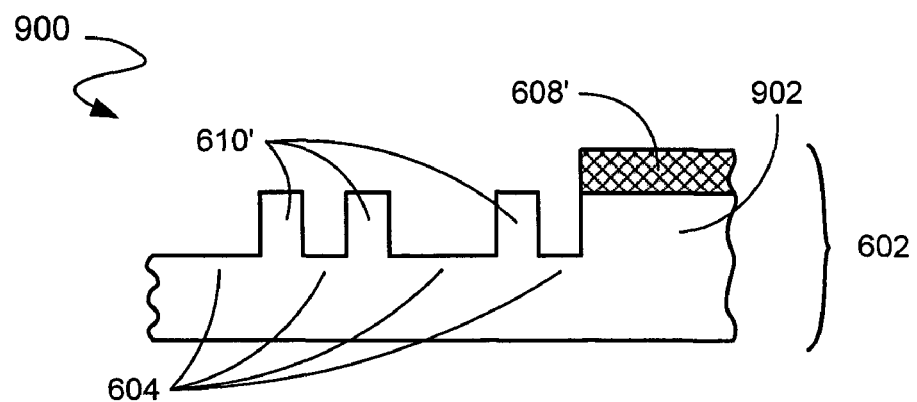
FIG. 9 is a cross-sectional view of a central portion of the side lobe reducing photomask design depicted in FIG. 6, taken on cross-sectional line 9-9 therein.

Referring now to FIG. 9, therein is shown a partial cross-sectional view 900 of a central portion of the side lobe reducing photomask design 600, taken on cross-sectional line 9-9 in FIG. 6, through and partially beyond the 180° phase subregions 610' thereon. A phase shift mesa is made up of the 180° phase subregions 610' and a 180° phase region 902. The chrome patch 608' is placed over the larger 180° phase region 902. Due to the destructive interference of the checkerboard pattern, the chrome patch 608' is not needed over the smaller 180° phase subregions 610' of the phase shift mesa. This prevents the risk of chrome lifting in the very small regions of the checkerboard pattern by eliminating the many small chrome patches that would otherwise be needed is such small areas. The time it takes for cleaning and inspection of the photomask and repair of the chrome patches is thus greatly reduced through the elimination of numerous such small patches.

Figure 10:
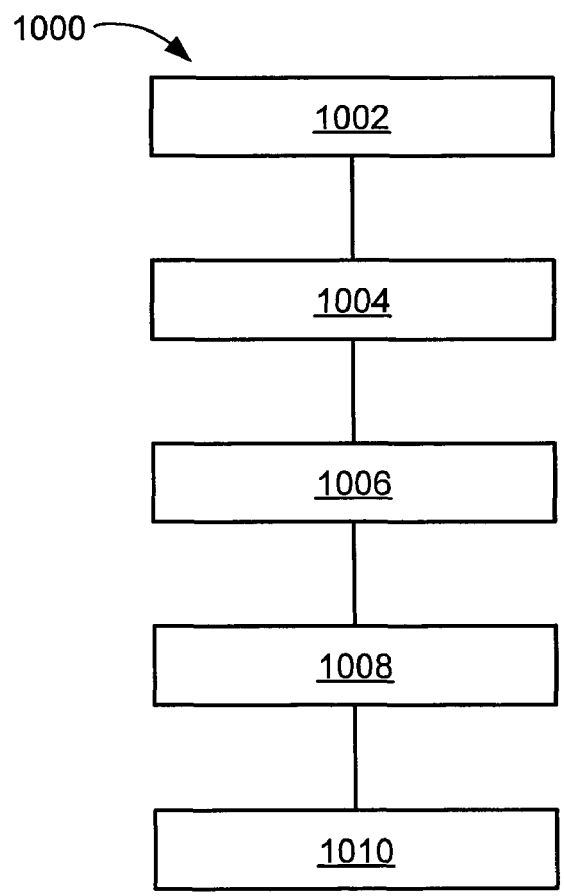
FIG. 10 is a flow chart of a method for reducing side lobe formation in accordance with the present invention.

Referring now to FIG. 10, therein is shown a flow chart of a method 1000 for reducing side lobe formation in accordance with the present invention. The method 1000 includes positioning a first region of a first phase at a first plane, the first region transparent to radiation, in a block 1002; positioning a second region of a second phase at the first plane, the second region transparent to radiation and the second phase being substantially out of phase to the first phase, in a block 1004; positioning the first region and the second region to cause radiation from the first plane to be neutralized in a first region at a second plane, not to be neutralized in a second region at the second plane, and to have a side lobe from the radiation in a third region at the second plane, in a block 1006; positioning a non-transparent region at the first plane to assure radiation from the first plane to be neutralized in the first region at the second plane, in a block 1008; and positioning a third region of the first phase or the second phase at the first plane to neutralize the side lobes in the third region at the second plane, in a block 1010.

Thus, it has been discovered that the side lobe formation reducing method and apparatus of the present invention furnish important and heretofore unknown and unavailable solutions, capabilities, and functional advantages for reducing side lobe formation. The resulting process and configurations are straightforward, economical, uncomplicated, highly versatile, accurate, sensitive, and effective, and can be implemented by adapting known components for ready manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for removing side lobes comprising:
 positioning a first region of a first phase at a first plane, the first region transparent to radiation;
 positioning a second region of a second phase at the first plane, the second region transparent to radiation and the second phase being substantially out of phase to the first phase;
 positioning the first region and the second region to cause radiation from the first plane to be neutralized in a first region at a second plane, not to be neutralized in a second region at the second plane, and to have a side lobe from the radiation in a third region at the second plane;
 positioning a non-transparent region at the first plane to assure radiation from the first plane to be neutralized in the first region at the second plane; and
 positioning a third region of the first phase or the second phase at the first plane to neutralize the side lobes in the third region at the second plane.

2. The method of claim 1 wherein positioning the first region and the second region at the first plane further comprises positioning the first region and the second region at the first plane to form the second region at the second plane into a design.

3. The method of claim 1 wherein positioning the third region further comprises forming the third region of adjacent subregions arranged in an alternating checkerboard pattern of the first phase or the second phase.

4. The method of claim 1 wherein:
 positioning the first region and the second region further comprises forming the first and second regions to be of different sizes;
 positioning the non-transparent region further comprises forming the non-transparent region to a first size larger than the different sizes of the first region or the second region; and
 positioning the third region further comprises forming the third region to a second size smaller than the different sizes of the first region and the second region.

5. The method of claim 1 further comprising:
 positioning a fourth region of the first phase or the second phase at a first plane, the fourth region transparent to radiation and having a first width, the fourth region located in a space larger than the first width from the first or second regions; and
 positioning the third region at the first plane further comprises providing the third region in the space where the space is larger than two times the first width and less than four times the first width.

6. A method for removing side lobes comprising:
 positioning a first region of a first phase at a photomask, the first region transparent to light;
 positioning a second region of a second phase at the photomask, the second region transparent to light and the second phase being substantially out of phase to the first phase;
 positioning the first region and the second region to cause light from the photomask to be neutralized in a first region at a photoresist, not to be neutralized in a second region at the photoresist, and to have a side lobe from the light in a third region at the photoresist;
 positioning a non-transparent region of a first size proximate the first region and the second region at the photomask to assure light from the photomask to be neutralized in the first region at the photoresist, the non-transparent region opaque to radiation; and
 positioning a third region of the first phase and the second phase at the photomask to neutralize the side lobes in the third region at the photoresist, the third region at the photomask having a second size smaller than the first size and transparent to light.

7. The method of claim 6 wherein positioning the first region and the second region at the photomask further comprises positioning the first region and the second region at the photomask to form the second region at the photoresist into a design.

8. The method of claim 6 wherein positioning a third region further comprises forming the third region of adjacent subregions arranged in an alternating square checkerboard pattern of the first phase and the second phase.

9. The method of claim 6 wherein:
 positioning the first region and the second region further comprises forming the first and second regions to be of different sizes;
 positioning the non-transparent region further comprises forming the first size thereof to be larger than the different sizes of the first region or the second region; and
 positioning the third region further comprises forming the second size thereof to be smaller than the different sizes of the first region and the second region.

10. The method of claim 6 further comprising:
 positioning a fourth region of the first phase or the second phase at a photomask, the fourth region transparent to light and having a first width, the fourth region located in a space larger than the first width from the first or second regions; and
 positioning the third region at the photomask further comprises providing the third region in the space where the space is larger than two times the first width and less than four times the first width.

11. A structure for removing side lobes comprising:
 a first region of a first phase at a first plane, the first region transparent to radiation;

a second region of a second phase at the first plane, the second region transparent to radiation and the second phase substantially out of phase to the first phase;

the first region and the second region being positioned to cause radiation from the first plane to be neutralized in a first region at a second plane, not to be neutralized in a second region at the second plane, and to have a side lobe from the radiation in a third region at the second plane;

a non-transparent region at the first plane to assure radiation from the first plane to be neutralized in the first region at the second plane, the non-transparent region opaque to radiation; and a third region of the first phase or the second phase at the first plane to neutralize the side lobes in the third region at the second plane.

12. The structure of claim 11 wherein the first region and the second region at the first plane further comprises the first region and the second region positioned at the first plane to form the second region at the second plane into a design.

13. The structure of claim 11 wherein the third region further comprises the third region of adjacent subregions arranged in an alternating checkerboard pattern of the first phase or the second phase.

14. The structure of claim 11 wherein:
the first region and the second region further comprises the first and second regions of different sizes;
the non-transparent region further comprises the size of the non-transparent region to be larger than the different sizes of the first region or the second region; and
the third region further comprises the size of the third region to be smaller than the different sizes of the first region and the second region.

15. The structure of claim 11 further comprising:
a fourth region of the first phase or the second phase at a first plane, the fourth region transparent to radiation and having a first width, the fourth region located in a space larger than the first width of the first or second regions; and
the third region at the first plane further comprises the third region being provided in the space where the space is larger than two times the first width and less than four times the first width.

16. A structure for removing side lobes comprising:
a first region of a first phase at a photomask, the first region transparent to light;

a second region of a second phase at the photomask, the second region transparent to light and the second phase being substantially out of phase to the first phase;

the first region and the second region being positioned to cause light from the photomask to be neutralized in a first region at a photoresist, not to be neutralized in a second region at the photoresist, and to have a side lobe from the light in a third region at the photoresist;

a non-transparent region of a first size proximate the first region and the second region at the photomask to assure light from the photomask to be neutralized in the first region at the photoresist, the non-transparent region opaque to light; and a third region of the first phase and the second phase at the photomask to neutralize the side lobes in the third region at the photoresist, the third region at the photomask having a second size smaller than the first size and transparent to light.

17. The structure of claim 16 wherein the first region and the second region at the photomask further comprises the first region and the second region positioned at the photomask to form the second region at the photoresist into a design.

18. The structure of claim 16 wherein a third region further comprises the third region of adjacent subregions arranged in an alternating square checkerboard pattern of the first phase and the second phase.

19. The structure of claim 16 wherein:
the first region and the second region further comprises the first and second regions of different sizes;
the non-transparent region further comprises the first size non-transparent region to be larger than the different sizes of the first region or the second region; and
the third region further comprises the second size of the third region to be smaller than the different sizes of the first region and the second region.

20. The structure of claim 16 further comprising:
a fourth region of the first phase or the second phase at a photomask, the fourth region transparent to light and having a first width, the fourth region located in a space larger than the first width of the first or second regions; and
the third region at the photomask further comprises the third region being located in the space where the space is larger than two times the first width and less than four times the first width.

* * * * *